(12) United States Patent
Takaki et al.

(10) Patent No.: US 7,968,278 B2
(45) Date of Patent: Jun. 28, 2011

(54) RINSE TREATMENT METHOD AND DEVELOPMENT PROCESS METHOD

(75) Inventors: Yasuhiro Takaki, Koshi (JP); Osamu Miyahara, Koshi (JP); Keiichi Tanaka, Koshi (JP); Shinya Wakamizu, Koshi (JP); Takashi Terada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 704 days.

(21) Appl. No.: 11/578,055

(22) PCT Filed: Mar. 2, 2005

(86) PCT No.: PCT/JP2005/003486
§ 371 (c)(1),
(2), (4) Date: Oct. 12, 2006

(87) PCT Pub. No.: WO2005/101468
PCT Pub. Date: Oct. 27, 2005

(65) Prior Publication Data
US 2008/0274433 A1   Nov. 6, 2008

(30) Foreign Application Priority Data
Apr. 13, 2004   (JP) ................... 2004-118233

(51) Int. Cl.
*G03F 7/26* (2006.01)
*G03F 7/30* (2006.01)
(52) U.S. Cl. ......... 430/401; 430/331; 430/427; 430/434
(58) Field of Classification Search ............... 430/270.1, 430/331, 322, 434
See application file for complete search history.

(56) References Cited

U.S. PATENT DOCUMENTS

| 6,159,662 | A | * | 12/2000 | Chen et al. | 430/313 |
| 6,352,818 | B1 | * | 3/2002 | Hsieh | 430/322 |
| 2005/0223980 | A1 | * | 10/2005 | Awamura et al. | 118/708 |
| 2006/0124586 | A1 | * | 6/2006 | Kobayashi et al. | 216/41 |

FOREIGN PATENT DOCUMENTS

| JP | 07 142349 | 6/1995 |
| JP | 2001 005191 | 1/2001 |
| JP | 2003 178942 | 6/2003 |
| JP | 2003 178943 | 6/2003 |
| JP | 2003 178944 | 6/2003 |
| JP | 2003 178946 | 6/2003 |
| JP | 2004 014844 | 1/2004 |
| JP | 2004-22764 | 1/2004 |
| WO | WO 03/105201 | * 12/2003 |
| WO | WO 2004/051379 | * 6/2004 |

* cited by examiner

Primary Examiner — Cynthia H Kelly
Assistant Examiner — Anca Eoff
(74) Attorney, Agent, or Firm — Oblon, Spivak, McClelland, Maier & Neustadt, L.L.P.

(57) ABSTRACT

A rinsing method for performing a rinsing process on a substrate, after a developing process is performed on a light-exposed pattern disposed thereon, includes a step (STEP 5) of throwing off a developing solution from the substrate after development; a step (STEP 6) of supplying a water-based cleaning liquid onto the substrate; a step (STEP 7) of supplying a surfactant-containing rinsing liquid onto the substrate to replace liquid remaining on the substrate with the surfactant-containing rinsing liquid; and a step (STEP 8) of rotating the substrate to expand and throw off the surfactant-containing rinsing liquid on the substrate. STEP 8 is arranged to supply the surfactant-containing rinsing liquid for a supply time of 5 seconds or less. STEP 9 is arranged to include a first period with a lower rotation number and a second period with a higher rotation number, and to set the rotation number of the substrate in the first period to be more than 300 rpm and less than 1,000 rpm.

6 Claims, 13 Drawing Sheets

RINSE TREATMENT METHOD AND DEVELOPMENT PROCESS METHOD

TECHNICAL FIELD

The present invention relates to a rinsing method for performing a rinsing process on a substrate, such as a semiconductor wafer, after a developing process is performed on a light-exposed pattern disposed thereon, and a developing method including such a rinsing process.

BACKGROUND ART

For example, in the process of manufacturing semiconductor devices, a so-called photolithography technique is used to form a resist pattern as a mask for forming a predetermined pattern. According to a photolithography technique, a resist liquid is applied onto the surface of a semiconductor wafer (which will be referred to as "wafer") to form a resist film. Then, the wafer with the resist film formed thereon is subjected to a light exposure process in accordance with a predetermined pattern. Then, the wafer with the light-exposed pattern formed on the resist film is subjected to a developing process.

In the developing process used as one of the steps of the photolithography technique, a developing solution is supplied onto the wafer to form a developing solution puddle all over the surface. Then, this state is held for a predetermined time to promote the developing process by natural convection. Thereafter, the developing solution is thrown off, and purified water is then supplied as a cleaning liquid to wash out the developing solution remaining on the wafer. Then, the wafer is rotated at a high speed to throw off the developing solution and cleaning liquid remaining on the wafer, thereby drying the wafer.

In recent years, semiconductor devices are increasingly miniaturized with advances in light exposure techniques and so forth, and thus resist patterns with a smaller size and a higher aspect ratio have come into use. Accordingly, a problem arises such that resist patterns are pulled and bent by a surface tension of a rinsing liquid, i.e., so-called "pattern fall" is caused, when the rinsing liquid is being removed from gaps between the patterns during a step of throwing-off and drying at the end of the developing step described above.

As a technique to solve this problem, Patent Document 1 discloses a proposed technique such that, for example, a surfactant solution is mixed into a rinsing liquid to decrease the surface tension of the rinsing liquid. Further, Patent Document 2 discloses a process in which a surfactant is supplied when a rinsing process is performed on a substrate after a developing process.

Unlike the conventional process using purified water, however, where a surfactant is used together with a rinsing liquid, the surfactant may generate particles and adversely affect the process or may cause pattern deformation. So far, optimum process conditions in light of these problems have not yet been found in a rinsing process using a surfactant.

[Patent Document 1] Jpn. Pat. Appln. KOKAI Publication No. 7-142349
[Patent Document 2] Jpn. Pat. Appln. KOKAI Publication No. 2001-5191

DISCLOSURE OF INVENTION

An object of the present invention is to provide a rinsing method for performing a rinsing process using a surfactant after a developing process, wherein the method can optimize the process to prevent the particle generation and pattern deformation. Another object is to provide a developing method including such a rinsing process.

According to a first aspect of the present invention, there is provided a rinsing method for performing a rinsing process on a substrate, after a developing process is performed on a light-exposed pattern disposed thereon, the method comprising: a first step of throwing off a developing solution from the substrate after development; a second step of supplying a water-based cleaning liquid onto the substrate; a third step of supplying a surfactant-containing rinsing liquid onto the substrate to replace liquid remaining on the substrate with the surfactant-containing rinsing liquid; and a fourth step of rotating the substrate to expand and throw off the surfactant-containing rinsing liquid on the substrate, wherein the third step is arranged to supply the surfactant-containing rinsing liquid for a supply time of 5 seconds or less, and the fourth step is arranged to include a first period with a lower rotation number and a second period with a higher rotation number, and to set the rotation number of the substrate in the first period to be more than 300 rpm and less than 1,000 rpm.

According to a second aspect of the present invention, there is provided a developing method for developing a light-exposed pattern, after a resist film disposed on a substrate is subjected to light exposure with a predetermined pattern, the method comprising: a first step of applying a developing solution onto the resist film disposed on the substrate after the light exposure; a second step of holding the applied developing solution stationary to promote development; a third step of throwing off the developing solution from the substrate after the development; a fourth step of supplying a water-based cleaning liquid onto the substrate; a fifth step of supplying a surfactant-containing rinsing liquid onto the substrate to replace liquid remaining on the substrate with the surfactant-containing rinsing liquid; and a sixth step of rotating the substrate to expand and throw off the surfactant-containing rinsing liquid on the substrate, wherein the fifth step is arranged to supply the surfactant-containing rinsing liquid for a supply time of 5 seconds or less, and the sixth step is arranged to include a first period with a lower rotation number and a second period with a higher rotation number, and to set the rotation number of the substrate in the first period to be more than 300 rpm and less than 1,000 rpm.

In the first aspect of the present invention, the fourth step is preferably arranged to perform the first period for 5 to 15 seconds. The third step is preferably arranged to supply the surfactant-containing rinsing liquid onto the substrate while rotating the substrate at 500 rpm or less. The fourth step is preferably arranged to set the rotation number in the second period to be 1,000 to 4,000 rpm. The fourth step is preferably arranged to perform the second period for 10 to 20 seconds.

Further, the third step may be arranged to supply the surfactant-containing rinsing liquid through a rinsing liquid supply nozzle. The rinsing liquid supply nozzle preferably has a total delivery-hole area of 3 to 20 mm$^2$. The rinsing liquid supply nozzle is preferably disposed to be vertical or almost vertical. The water-based cleaning liquid and the surfactant-containing rinsing liquid may be purified water and a surfactant aqueous solution, respectively, which are supplied at controlled flow rates through separate lines and are delivered through a common nozzle.

In the second aspect of the present invention, the sixth step is preferably arranged to perform the first period for 5 to 15 seconds. The fifth step is preferably arranged to supply the surfactant-containing rinsing liquid onto the substrate while rotating the substrate at 500 rpm or less. The sixth step is preferably arranged to set the rotation number in the second period to be 1,000 to 4,000 rpm. The sixth step is preferably arranged to perform the second period for 10 to 20 seconds.

According to a third aspect of the present invention, there is provided a computer readable storage medium that stores software for a computer to control a developing apparatus to execute a rinsing process on a substrate, after a developing process is performed on a light-exposed pattern disposed thereon, wherein the rinsing process comprises: a first step of throwing off a developing solution from the substrate after development; a second step of supplying a water-based cleaning liquid onto the substrate; a third step of supplying a surfactant-containing rinsing liquid onto the substrate to replace liquid remaining on the substrate with the surfactant-containing rinsing liquid; and a fourth step of rotating the substrate to expand and throw off the surfactant-containing rinsing liquid on the substrate, such that the third step is arranged to supply the surfactant-containing rinsing liquid for a supply time of 5 seconds or less, and the fourth step is arranged to include a first period with a lower rotation number and a second period with a higher rotation number, and to set the rotation number of the substrate in the first period to be more than 300 rpm and less than 1,000 rpm.

According to a fourth aspect of the present invention, there is provided a computer readable storage medium that stores software for a computer to control a developing apparatus to execute a developing process on a substrate, after a resist film disposed thereon is subjected to light exposure with a predetermined pattern, wherein the developing process comprises: a first step of applying a developing solution onto the resist film disposed on the substrate after the light exposure; a second step of holding the applied developing solution stationary to promote development; a third step of throwing off the developing solution from the substrate after the development; a fourth step of supplying a water-based cleaning liquid onto the substrate; a fifth step of supplying a surfactant-containing rinsing liquid onto the substrate to replace liquid remaining on the substrate with the surfactant-containing rinsing liquid; and a sixth step of rotating the substrate to expand and throw off the surfactant-containing rinsing liquid on the substrate, such that the fifth step is arranged to supply the surfactant-containing rinsing liquid for a supply time of 5 seconds or less, and the sixth step is arranged to include a first period with a lower rotation number and a second period with a higher rotation number, and to set the rotation number of the substrate in the first period to be more than 300 rpm and less than 1,000 rpm.

According to the present invention, when the rinsing process is performed after the developing process, the surfactant-containing rinsing liquid is supplied onto the substrate to replacement liquid remaining on the substrate with the surfactant-containing rinsing liquid. This step is arranged to supply the surfactant-containing rinsing liquid for a supply time of 5 seconds or less, so pattern deformation is scarcely caused. Further, thereafter, the substrate is rotated to expand and throw off the surfactant-containing rinsing liquid on the substrate. This step is arranged to include two periods, i.e., a first period with a lower rotation number and a second period with a higher rotation number, and to set the rotation number of the substrate in the first period to be more than 300 rpm and less than 1,000 rpm. Consequently, an appropriate rinsing process can be performed while suppressing the occurrence of problems, such as particle deposition.

BEST MODE FOR CARRYING OUT THE INVENTION

Embodiments of the present invention will now be described with reference to the accompanying drawings.

Figure 1:
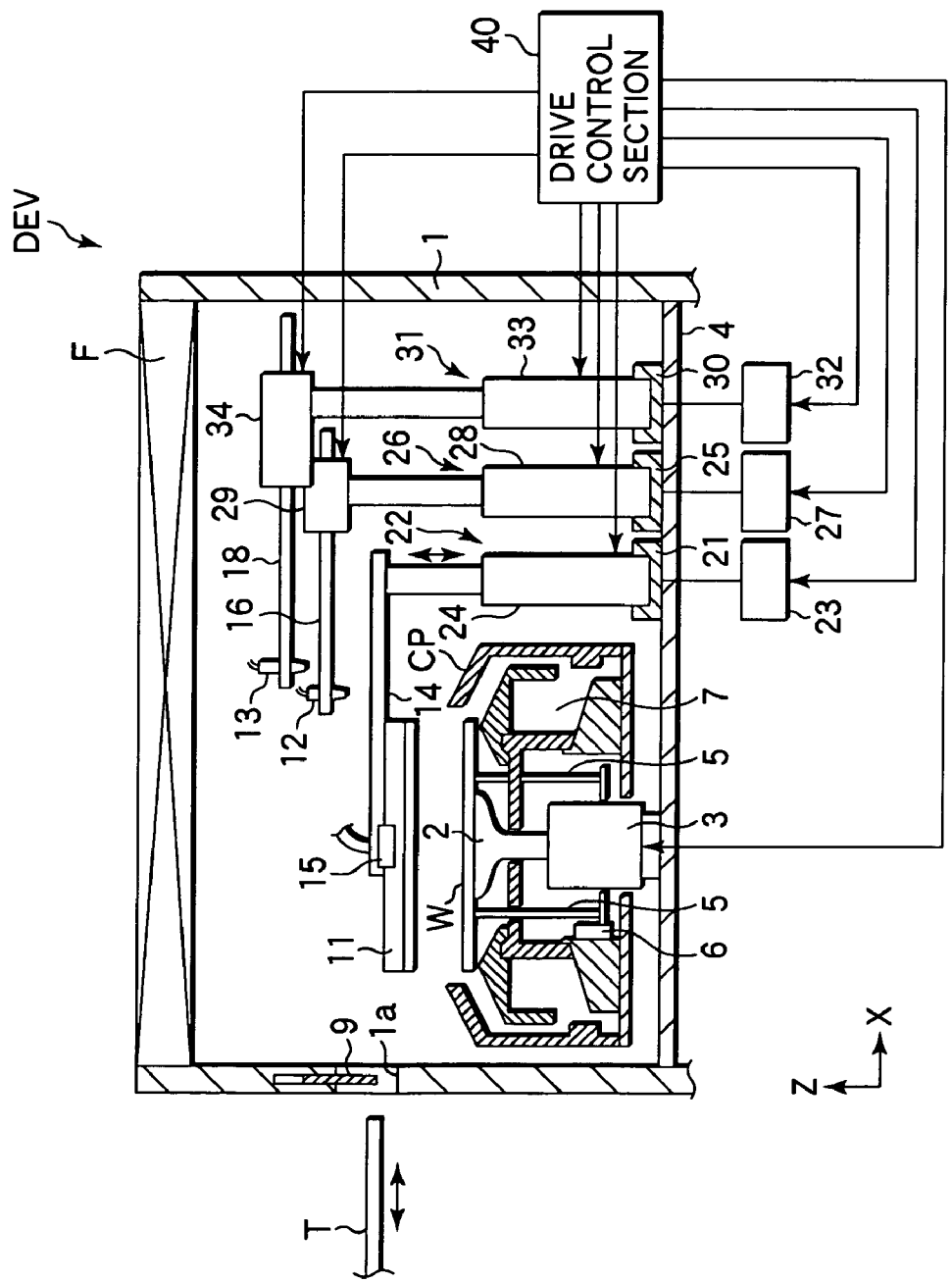
FIG. 1 This is a sectional view showing a developing apparatus arranged to perform a method according to an embodiment of the present invention.
Figure 2:
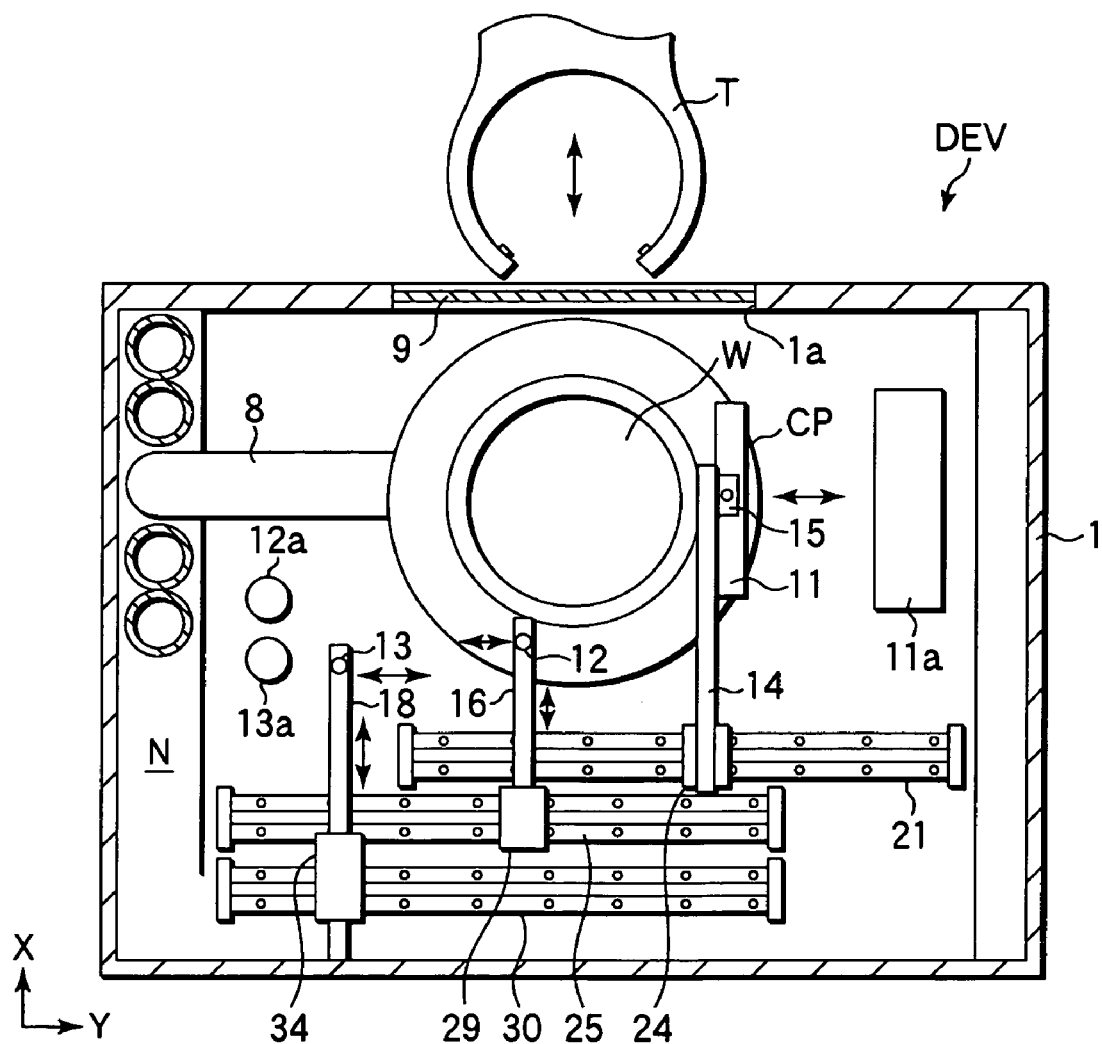
FIG. 2 This is a plan view showing the developing apparatus arranged to perform a method according to an embodiment of the present invention.

FIG. 1 is a sectional view showing a developing apparatus arranged to perform a method according to an embodiment of the present invention. FIG. 2 is a plan view of the developing apparatus. In the following description, two directions perpendicular to each other in the horizontal plane are denoted as an X-direction and a Y-direction, and the vertical direction is denoted as a Z-direction, as shown in FIGS. 1 and 2.

As shown in FIGS. 1 and 2, this developing apparatus (DEV) includes a casing 1 provided with a fan and filter unit F at the ceiling thereof to form a downflow of clean air in the casing. An annular cup CP is disposed at the center in the casing 1, and a spin chuck 2 is disposed inside the cup CP. The spin chuck 2 is arranged to fix and hold a wafer W by means of vacuum suction. The spin chuck 2 is operated to rotate by a drive motor 3 disposed below the spin chuck 2. The drive motor 3 is attached to a bottom plate 4.

Lifter pins 5 used for transferring the wafer W are disposed inside the cup CP and are movable up and down by a driving mechanism 6, such as an air cylinder. Further, a drain port 7 used for waste liquid is formed inside the cup CP. The drain port 7 is connected to a waste liquid tube 8 (see FIG. 2), which extends through a space N between the bottom plate 4 and casing 1, as shown in FIG. 2, and is connected to a waste liquid port (not shown) disposed below.

A sidewall of the casing 1 has an opening 1a formed therein that allows a transfer arm T of a wafer transfer unit to pass therethrough. The opening 1a is opened and closed by a shutter 9. When the wafer W is loaded/unloaded, the shutter 9 is opened, and the transfer arm T comes into the casing 1. The wafer W is transferred between the transfer arm T and the spin chuck 2, while the lifter pins 5 are present at the upper position.

A developing solution supply nozzle 11, a purified water supply nozzle 12, and a rinsing liquid supply nozzle 13 are disposed above the cup CP, such that each of them is movable between a supply position above the wafer W and a waiting position outside the wafer W. The developing solution supply nozzle 11 is used for supplying a developing solution onto the top surface of the wafer W. The purified water supply nozzle 12 is used for supplying a water-based cleaning liquid, such as purified water, onto the wafer W after the development. The rinsing liquid supply nozzle 13 is used for supplying a surfactant-containing rinsing liquid after the purified water rinsing. The surfactant-containing rinsing liquid is prepared by mixing and diluting a surfactant solution with purified water.

The developing solution supply nozzle 11 has an elongated shape and is disposed such that the longitudinal direction of the elongated shape is horizontal. The developing solution supply nozzle 11 has a plurality of delivery ports on the bottom face to deliver the developing solution as a belt as a whole. The developing solution supply nozzle 11 is detachably attached to the distal end of a first nozzle scan arm 14 by a holding member 15. The first nozzle scan arm 14 is attached to the upper end of a first vertical support member 22, which stands up in a vertical direction from a first guide rail 21 extending in the Y direction on the bottom plate 4. The developing solution supply nozzle 11 is horizontally movable together with the first vertical support member 22 in the Y-direction by a Y-axis driving mechanism 23. Further, the first vertical support member 22 is movable up and down by a Z-axis driving mechanism 24, so that the developing solution supply nozzle 11 can be moved between a delivery position closer to the wafer W and a non-delivery position on the upper side by the up-and-down movement of the first vertical support member 22. When the developing solution is applied, the developing solution supply nozzle 11 is placed at a position above the wafer W. Then, while the developing solution is delivered as a belt from the developing solution supply nozzle 11, the wafer W is rotated by 180° or more, such as 360°. Consequently, the developing solution is applied all over the surface of the wafer W to form a developing solution puddle. Alternatively, when the developing solution is delivered, the developing solution supply nozzle 11 may be moved along the first guide rail 21 for scanning without rotating the wafer W.

The purified water supply nozzle 12 is formed of a straight nozzle. After the developing step is finished, the purified water supply nozzle 12 is moved to a position above the wafer W. Then, purified water used as the water-based cleaning liquid is supplied from the nozzle 12 onto the wafer W with the resist film having a developed pattern. The purified water supply nozzle 12 is detachably attached to the distal end of a second nozzle scan arm 16. A second guide rail 25 is disposed on the bottom plate 4 at a position outside the first guide rail 21. The second nozzle scan arm 16 is attached through an X-axis driving mechanism 29 to the upper end of a second vertical support member 26, which stands up in a vertical direction from the second guide rail 25. The purified water supply nozzle 12 is horizontally movable together with the second vertical support member 26 in the Y-direction by a Y-axis driving mechanism 27. Further, the second vertical support member 26 is movable up and down by a Z-axis driving mechanism 28, so that the purified water supply nozzle 12 can be moved between a delivery position closer to the wafer W and a non-delivery position on the upper side by the up-and-down movement of the second vertical support member 26. Furthermore, the second nozzle scan arm 16 is movable in the X-direction by the X-axis driving mechanism 29. The shape of the purified water supply nozzle 12 is not limited to a specific one. The nozzle 12 may have an elongated shape with a number of delivery ports formed therein, as in the developing solution supply nozzle 11. Alternatively, the nozzle 12 may be formed of a slit nozzle with a slit-like delivery port.

The rinsing liquid supply nozzle 13 is also formed of a straight nozzle. After the purified water rinsing is finished, the rinsing liquid supply nozzle 13 is moved to a position above the wafer W. Then, the surfactant-containing rinsing liquid is supplied from the nozzle 13 onto the wafer W after the purified water rinsing. The rinsing liquid supply nozzle 13 is detachably attached to the distal end of a third nozzle scan arm 18. A third guide rail 30 is disposed on the bottom plate 4 at a position outside the second guide rail 25. The third nozzle scan arm 18 is attached through an X-axis driving mechanism 34 to the upper end of a third vertical support member 31, which stands up in a vertical direction from the third guide rail 30. The rinsing liquid supply nozzle 13 is horizontally movable together with the third vertical support member 31 in the Y-direction by a Y-axis driving mechanism 32. Further, the third vertical support member 31 is movable up and down by a Z-axis driving mechanism 33, so that the rinsing liquid supply nozzle 13 can be moved between a delivery position closer to the wafer W and a non-delivery position on the upper side by the up-and-down movement of the third vertical support member 31. Furthermore, the third nozzle scan arm 18 is movable in the X-direction by the X-axis driving mechanism 34. The shape of the rinsing liquid supply nozzle 13 is not limited to a specific one. The nozzle 13 may have an elongated shape with a number of delivery ports formed therein, as in the developing solution supply nozzle 11. Alternatively, the nozzle 13 may be formed of a slit nozzle with a slit-like delivery port.

The Y-axis driving mechanisms 23, 27, and 32, Z-axis driving mechanisms 24, 28, and 33, X-axis driving mechanisms 29 and 34, and drive motor 3 are controlled by a drive control section 40.

As shown in FIG. 2, on the right side of the cup CP, a developing solution supply nozzle waiting portion 11a is disposed for the developing solution supply nozzle 11 to wait. The developing solution supply nozzle waiting portion 11a is provided with a cleaning mechanism (not shown) for cleaning the developing solution supply nozzle 11. On the left side of the cup CP, a purified water supply nozzle waiting portion 12a and a rinsing liquid supply nozzle waiting portion 13a are disposed for the purified water supply nozzle 12 and rinsing liquid supply nozzle 13 to wait, respectively. The purified water supply nozzle waiting portion 12a and rinsing liquid supply nozzle waiting portion 13a are provided with cleaning mechanisms (not shown) for cleaning the purified water supply nozzle 12 and rinsing liquid supply nozzle 13, respectively.

Figure 3:
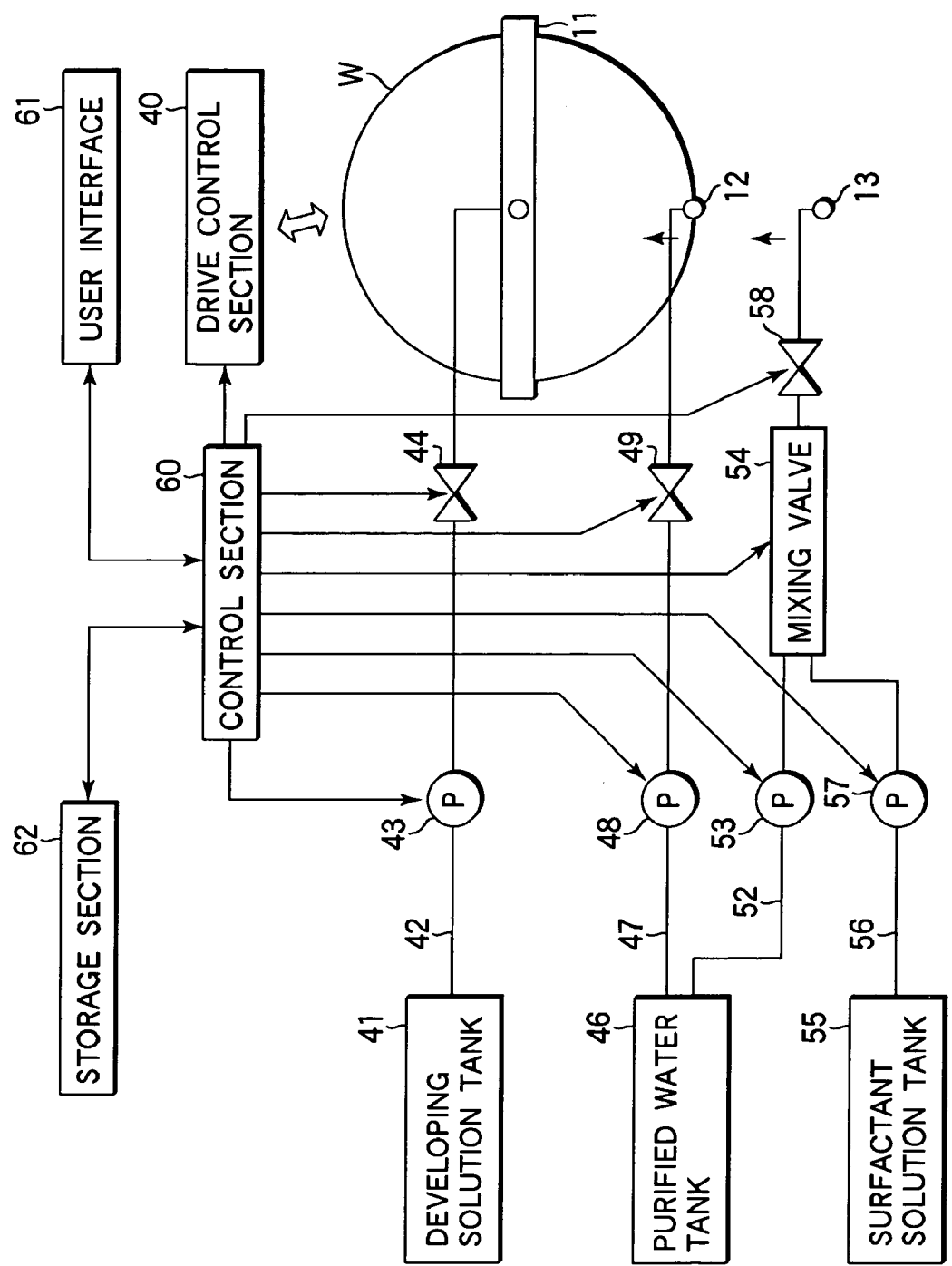
FIG. 3 This is a view schematically showing a liquid supply system used in the developing apparatus shown in FIGS. 1 and 2.

FIG. 3 is a view schematically showing a liquid supply system and a control system used in the developing apparatus (DEV). As shown in FIG. 3, the developing solution supply nozzle 11 is connected to a developing solution supply line 42 for supplying the developing solution from a developing solution tank 41 that stores the developing solution. The developing solution supply line 42 is provided with a pump 43 for supplying the developing solution and an ON/OFF valve 44.

The purified water supply nozzle 12 is connected to a purified water supply line 47 for supplying purified water used as the water-based cleaning liquid from a purified water tank 46 that stores purified water. The purified water supply line 47 is provided with a pump 48 for supplying purified water and an ON/OFF valve 49.

On the other hand, the rinsing liquid supply nozzle 13 is connected to a purified water supply line 52 for supplying purified water from the purified water tank 46. The purified water supply line 52 is provided with a mixing valve 54 on the way. The mixing valve 54 is connected to a surfactant solution supply line 56 extending from a surfactant solution tank 55 that stores a surfactant solution. The surfactant solution is mixed with purified water within the mixing valve 54. The rinsing liquid supply nozzle 13 can deliver the surfactant-containing rinsing liquid prepared by mixing the surfactant solution with purified water. The purified water supply line 52 and surfactant solution supply line 56 are respectively provided with pumps 53 and 57 upstream from the mixing valve 54. Further, the purified water supply line 52 is provided with an ON/OFF valve 58 downstream from the mixing valve 54.

The pumps 43, 48, 53, and 57, ON/OFF valves 44, 49, and 58, mixing valve 54, drive control section 40, and the other components of the developing apparatus (DEV) are electrically connected to and controlled by a control section 60.

The control section 60 is connected to a user interface 61 including, e.g., a keyboard and a display, wherein the keyboard is used for a process operator to input commands for operating the developing apparatus (DEV), and the display is used for showing visualized images of the operational status of the developing apparatus (DEV).

Further, the control section 60 is connected to a storage section 62 that stores control programs for the control section 60 to control the developing apparatus (DEV) so as to perform various processes, and programs or recipes for respective components of the developing apparatus to perform processes in accordance with process conditions. Recipes may be stored in a hard disk or semiconductor memory, or stored in a portable storage medium, such as a CDROM or DVD, to be attached to a predetermined position in the storage section 62. Further, recipes may be transmitted from another apparatus through, e.g., a dedicated line, as needed.

A required recipe is retrieved from the storage section 62 and executed by the control section 60 in accordance with an instruction or the like through the user interface 61. Consequently, the developing apparatus (DEV) can perform a predetermined process under the control of the control section 60.

As described above, the surfactant solution is diluted by means of inline processing because the necessary amount of surfactant varies depending on process conditions and/or patterns. Accordingly, this arrangement makes it possible to use a high-concentration surfactant solution, while suitably diluting it with purified water, so as to match it with any requirement.

Figure 4:
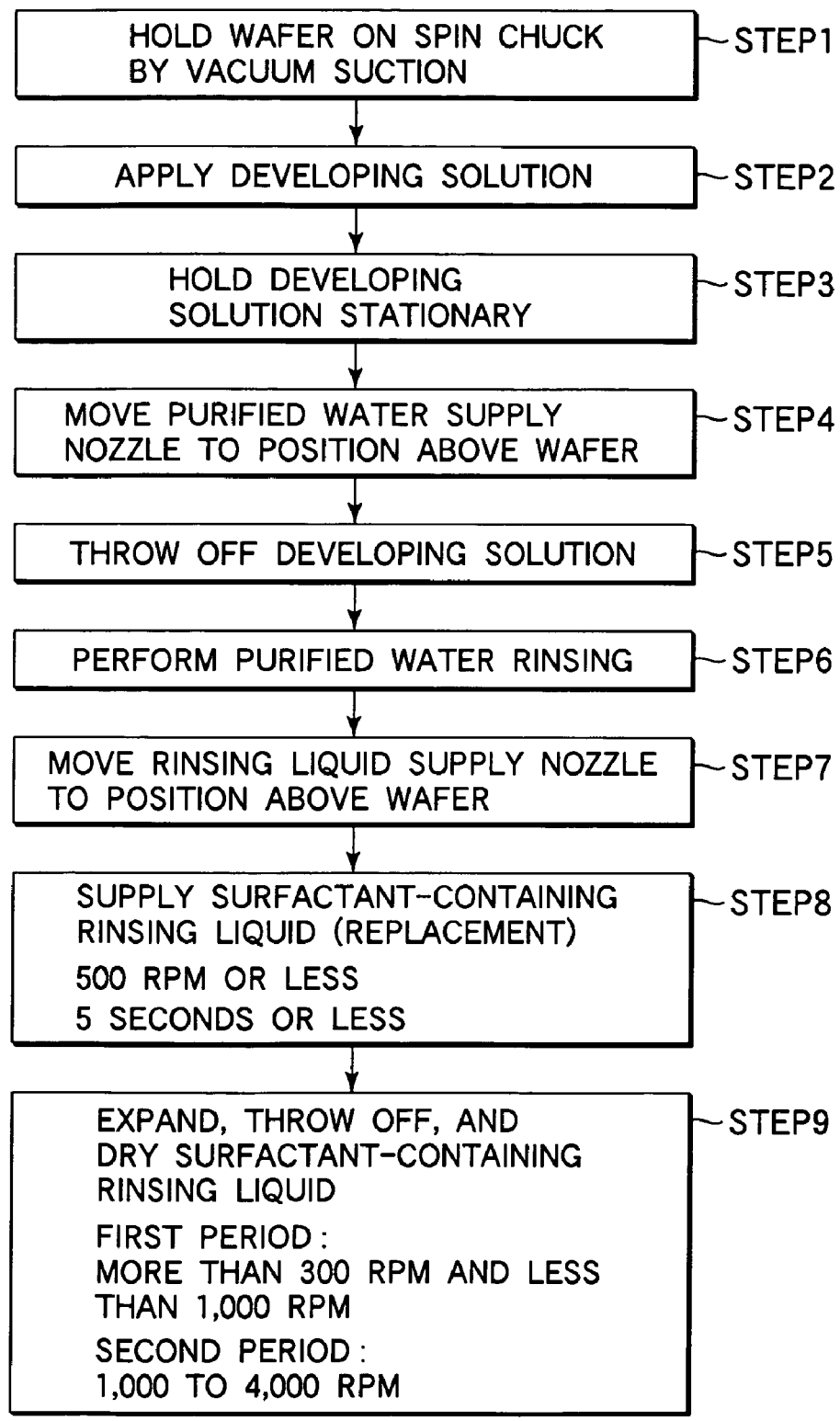
FIG. 4 This is a flowchart showing steps of a developing process.

Next, an explanation will be given of an operation of the developing process performed in the developing apparatus (DEV) described above, with reference to the steps shown in FIG. 4.

A wafer W is subjected to light exposure to form a predetermined pattern, and is then subjected to a post-exposure baking process and a cooling process. Then, the wafer W is transferred by the transfer arm T of the wafer transfer unit to a position directly above the cup CP. Then, the wafer W is transferred by the lifter pins 5 onto the spin chuck 2 and is held by vacuum suction (STEP 1).

Then, the developing solution supply nozzle 11 is moved to a position above wafer W. Then, while the developing solution is delivered as a belt from the developing solution supply nozzle 11, the wafer W is rotated by 180° or more, such as 360°. Consequently, the developing solution is applied all over the surface of the wafer W to form a developing solution puddle having a thickness of, e.g., 1.2 mm (STEP 2). Alternatively, the developing solution supply nozzle 11 may be moved along the guide rail 21 for scanning while delivering the developing solution.

Then, the state of the wafer W with the developing solution applied thereon is held stationary for an appropriate time, such as 60 seconds, to promote the development (STEP 3). During this time, the nozzle arm 16 of the purified water supply nozzle 12 is moved to place the purified water supply nozzle 12 at a position above the wafer W (STEP 4).

When a predetermined time has elapsed, the wafer W starts being rotated by the spin chuck 2 to throw off the developing solution (STEP 5). Then, purified water rinsing is performed (STEP 6). In this step, the following operation is preferably performed. Specifically, when the rotation number reaches 500 to 2,000 rpm, such as 1,000 rpm, purified water is supplied for 2 seconds or more, such as 5 seconds, while the rotation number is maintained. Then, while purified water is supplied, the rotation number is decreased to 100 to 1,000 rpm, such as 500 rpm, and this rotation number is maintained for 2 seconds or more, such as 10 seconds. The rotation number in STEP 6 is set at an optimum value selected in accordance with the size of a wafer W to be processed. Incidentally, there may be a case where a hardly soluble layer, which is thus difficult to remove by ordinary rinsing, is formed on the resist film on the wafer W, if purified water is supplied directly after the developing solution is thrown off. In this respect, where rinsing is performed using purified water and the developing solution prior to rinsing using only purified water, it is possible to prevent a hardly soluble layer from being generated on the resist film.

After the purified water rinsing is performed, the purified water supply nozzle 12 is retreated, and the nozzle arm 18 of the rinsing liquid supply nozzle 13 is moved to place the rinsing liquid supply nozzle 13 at an essentially central position above the wafer W (STEP 7). Then, while the wafer W is rotated preferably at 500 rpm or less, such as 100 rpm, the surfactant-containing rinsing liquid is supplied onto the wafer W to replace most of the purified water and residual developing solution on the resist film with the surfactant-containing rinsing liquid (STEP 8). In other words, the surface of the resist film is replaced with the surfactant-containing rinsing liquid. Since surfactants are expensive, the consumption amount thereof should be as low as possible. In this respect, if the surfactant-containing rinsing liquid is supplied while the wafer W is held stationary, the consumption amount necessary for replacement is increased. On the other hand, if the wafer W is rotated at a speed more than 500 rpm at this time, the amount of rinsing liquid thrown off by the rotation is increased. In light of these matters, the wafer W is rotated at 500 rpm or less while the surfactant-containing rinsing liquid is supplied. Consequently, the amount of rinsing liquid thrown off by the rotation can be decreased without deteriorating the replacement ability of the rinsing liquid, so the consumption amount of the surfactant-containing rinsing liquid can be set as low as possible.

Figure 5:
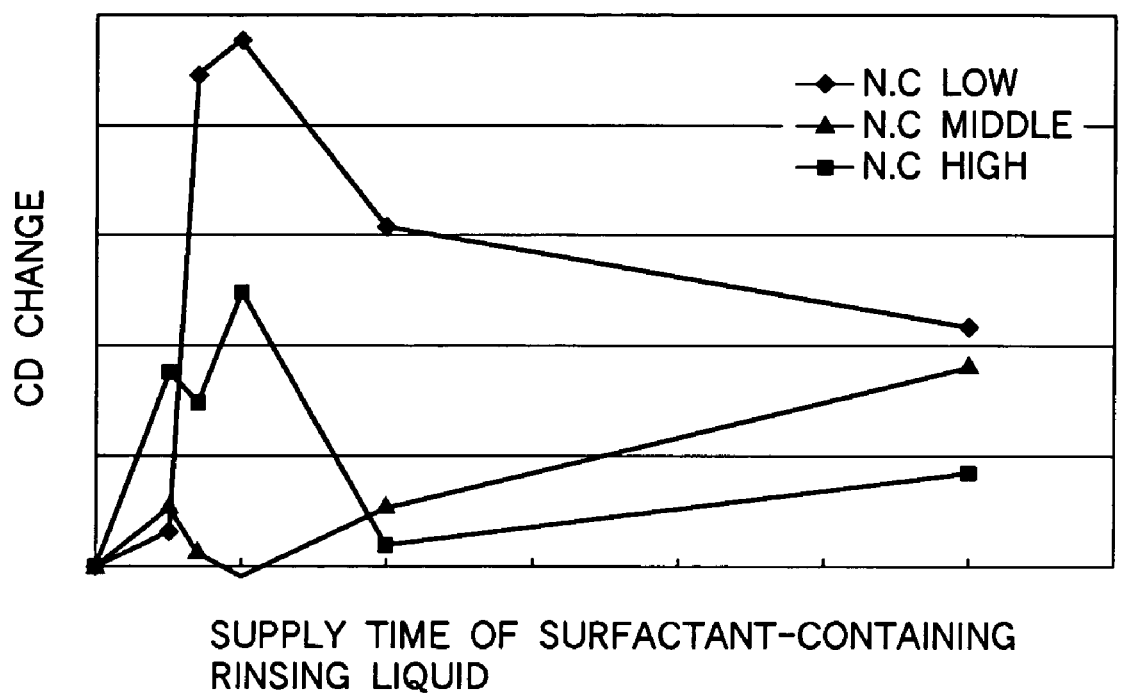
FIG. 5 This is a view showing the relationship of the CD change relative to the supply time of a surfactant-containing rinsing liquid.

The supply (replacement) time of the surfactant-containing rinsing liquid is preferably set to be 5 seconds or less. If this is longer than 5 seconds, the CD (Critical Dimension) of developed line width renders a large change. This phenomenon will be explained with reference to FIG. 5. FIG. 5 is a view showing the relationship of the CD change, which is denoted on the vertical axis, relative to the supply time, which is denoted on the horizontal axis, where the surfactant concentration was set at three different levels. In this case, the surfactant concentration was set at high, middle, and low levels of normalized concentration (N.C: Normalized Concentration). As shown in FIG. 5, the CD tends to suddenly increase when the elapsed time exceeds about 5 seconds. On the other hand, the CD tends to be stable when the elapsed time is longer, but a longer supply time is not preferable in consideration of the throughput and tact time. Accordingly, the supply time of the surfactant-containing rinsing liquid for performing the replacement is preferably set to be within a range of 5 seconds or less, with which the CD does not render a sudden increase. Further, the supply flow rate thereof at this time is preferably set to be 200 to 1,200 mL/min.

After the replacement with the surfactant-containing rinsing liquid is performed, the rotation number of the wafer W is increased to expand the surfactant-containing rinsing liquid and to throw off and dry the rinsing liquid (STEP 9). This step is performed by use of two periods formed of a first period and a second period.

Figure 6:
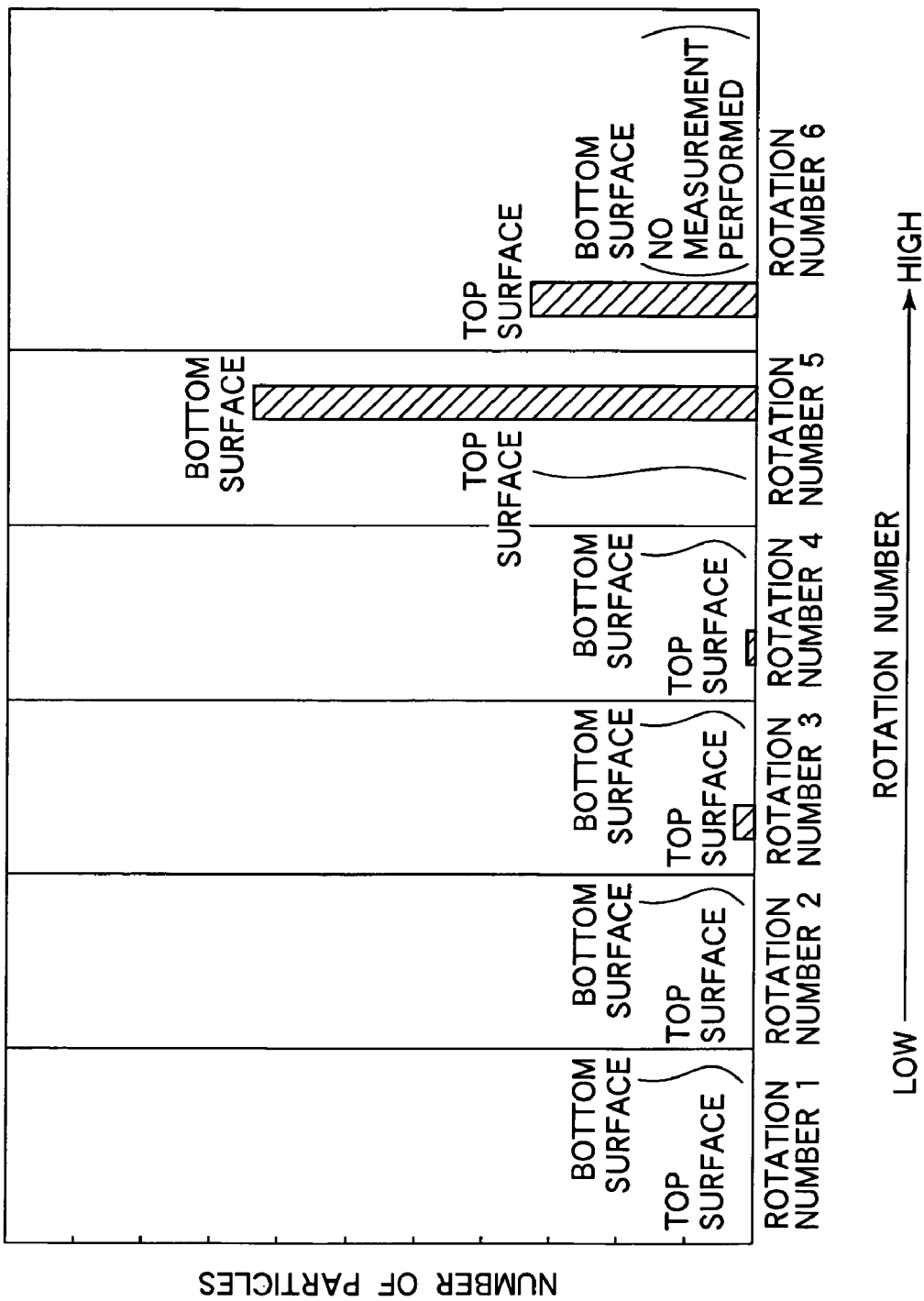
FIG. 6 This is a view showing the relationship of the top surface and bottom surface particles relative to the rotation number in the first period of a step of expanding a surfactant-containing rinsing liquid and throwing off and drying the rinsing liquid.
Figure 7A:
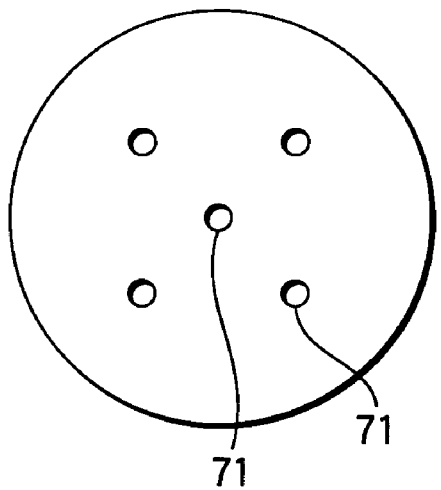
FIG. 7A This is a bottom view showing a preferable example of a rinsing liquid supply nozzle.
Figure 7B:
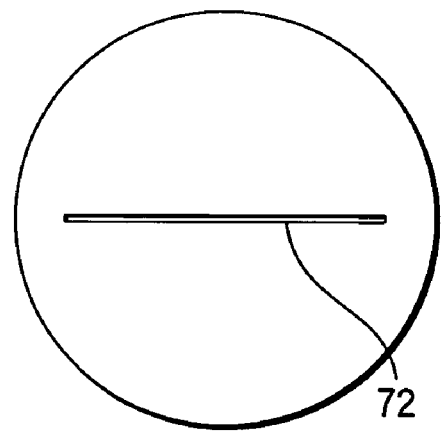
FIG. 7B This is a bottom view showing a preferable example of a rinsing liquid supply nozzle.
Figure 7C:
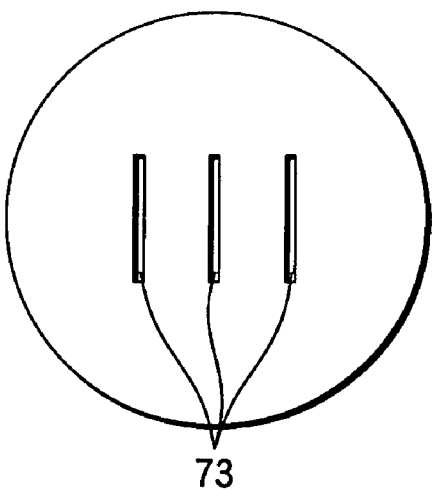
FIG. 7C This is a bottom view showing a preferable example of a rinsing liquid supply nozzle.
Figure 7D:
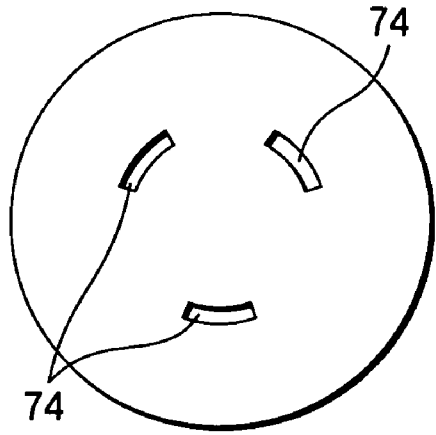
FIG. 7D This is a bottom view showing a preferable example of a rinsing liquid supply nozzle.

The first period is preferably arranged to set the rotation number of the wafer W to be more than 300 rpm and less than 1,000 rpm, such as 500 rpm. The reason of this will be explained with reference to FIG. 6. FIG. 6 is a view showing the relationship of the top surface and bottom surface particles relative to the rotation number in the first period. In this case, the rotation was held for 10 seconds. As shown in FIG. 6, the top surface particles were scarcely counted where the rotation number was low, but the counted number of particles was suddenly increased at Rotation number 6 (about 2,000 rpm). On the other hand, the bottom surface particles was zero up to Rotation number 4, but the counted number of particles was suddenly increased at Rotation number 5 (about 1,000 rpm). At Rotation number 2 (about 300 rpm), no particles were generated, but liquid droplets were generated on the cup, which could adversely affect the subsequent process. Accordingly, the rotation number in the first period is preferably set to be within a range of more than 300 rpm and less than 1,000 rpm. The time of the first period is preferably set to be 5 to 15 seconds, such as 10 seconds.

The second period is preferably arranged to set the rotation number of the wafer W to be 1,000 to 4,000 rpm, such as 2,000 rpm. As described above, for the first period, it is necessary to consider the influence of particles due to the surfactant. However, since the second period is not so affected by particles, the rotation number is preferably set to be within a range of 1,000 to 4,000 rpm, so as to efficiently perform drying without causing pattern fall. The time of the second period is preferably set to be 10 to 20 seconds, such as 15 seconds.

As described above, since the purified water and so forth are replaced with the surfactant-containing rinsing liquid having a low surface tension, pattern fall can be hardly caused in STEP 9 of performing throwing-off and drying. The surfactant concentration in the surfactant-containing rinsing liquid may be suitably set at a value within a range of 10,000 ppm or less to effectively prevent pattern fall. The surfactant may be preferably formed of a non-ionic surfactant.

As described above, according to this embodiment, supply conditions suitable for the use of the surfactant-containing rinsing liquid are defined to prevent pattern fall from being caused in throwing off the rinsing liquid. Specifically, STEP 8 is arranged to set the supply time (replacement time) of the surfactant-containing rinsing liquid to be 5 seconds or less. Further, STEP 9 is arranged to have the first period and second period with different values of the rotation number in expanding the surfactant-containing rinsing liquid and performing throwing-off and drying. The rotation number in the first period is preferably set to be within a range of more than 300 rpm and less than 1,000 rpm. Consequently, it is possible to suppress problems due to the CD change and/or particles.

In addition, STEP 8 is arranged to set the rotation number of the wafer to be 500 rpm or less in supplying the surfactant-containing rinsing liquid, thereby decreasing the consumption amount of rinsing liquid. Further, the rotation number in performing throwing-off and drying in the second period of STEP 9 is arranged to be 1,000 to 4,000 rpm, thereby efficiently performing drying while effectively preventing pattern fall.

In order to reliably remove the influence of particles, the rinsing liquid supply nozzle 13 is preferably subjected to dummy dispensing at any timing before the surfactant-containing rinsing liquid is supplied. This makes it possible to prevent residual surfactant or the like deposited in the rinsing liquid supply nozzle 13 from being supplied.

Next, an explanation will be given of a rinsing liquid nozzle preferably used for supplying the surfactant-containing rinsing liquid.

The surfactant-containing rinsing liquid has a low surface tension and thus tends to drip. Accordingly, it is necessary to improve the cutoff of the liquid. Further, in order to effectively prevent pattern fall, the delivery flow of the liquid needs to have a low impact. Furthermore, solution-saving is required for the surfactant-containing rinsing liquid. For the reasons described above, the rinsing liquid supply nozzle for delivering the surfactant-containing rinsing liquid is required to improve the cutoff of the liquid, to have a low impact, and to satisfy the solution-saving.

In order to improve the cutoff of the liquid, it is important for the delivery hole to have a smaller area, but the impact provided thereby becomes larger with a decrease in the sectional area of the delivery hole. Further, in order to improve the solution-saving, the flow rate of the liquid needs to be lower. In light of these aspects the total area of the delivery hole is preferably set to be 3 to 20 $mm^2$.

In consideration of these matters, specific examples of the rinsing liquid supply nozzle will be explained. FIGS. 7A to 7D are bottom views each showing an example of the rinsing liquid supply nozzle. The nozzle shown in FIG. 7A has a structure with one circular delivery hole 71 formed at the center and four circular delivery holes 71 formed around the center. Each of the delivery holes 71 has a size of 2.5 mmφ or less. The nozzle shown in FIG. 7B has one slit-like delivery hole 72 formed at the center. The slit-like delivery hole 72 has a length of about 3 to 5 mm and a width of about 1 to 4 mm. The nozzle shown in FIG. 7C has three slit-like delivery holes 73 formed in parallel with each other. Each of the deliver holes 73 has a length of about 2 to 6.5 mm and a width of about 0.5 to 1 mm. The nozzle shown in FIG. 7D has three sector-form delivery holes 74 formed along a circle centering oh the center of the nozzle bottom. Each of the deliver holes 74 has a length of about 2 to 6.5 mm and a width of about 0.5 to 1 mm.

Figure 8:
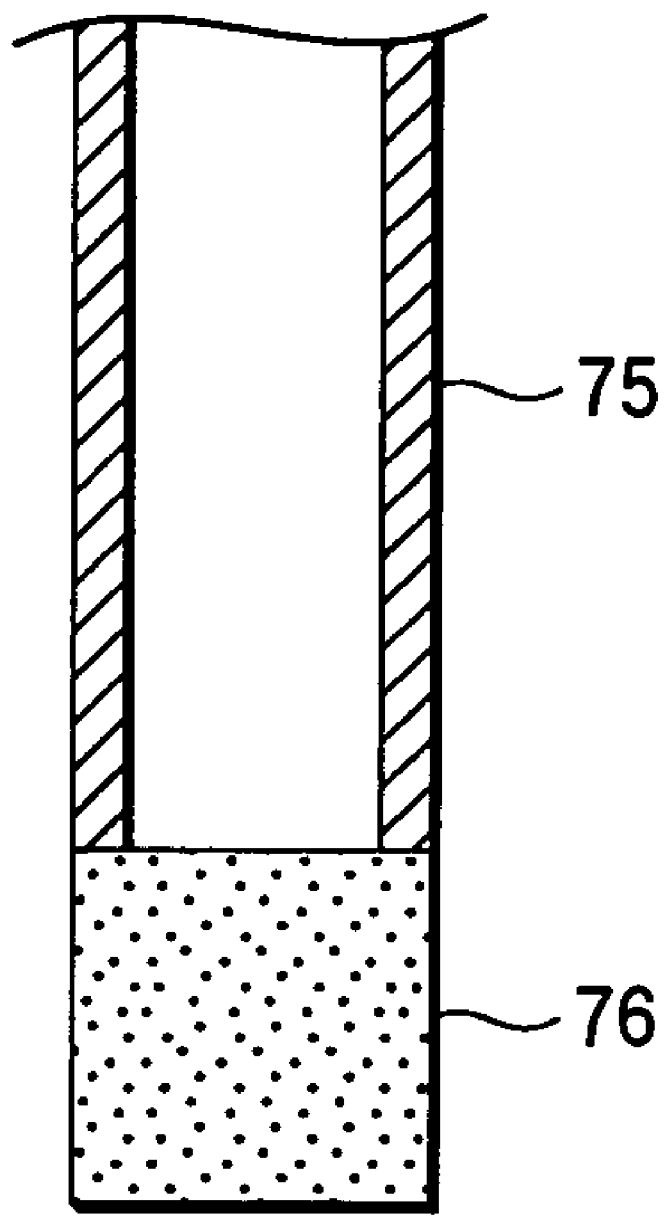
FIG. 8 This is a sectional side view showing an alternative preferable example of a rinsing liquid supply nozzle.
Figure 9:
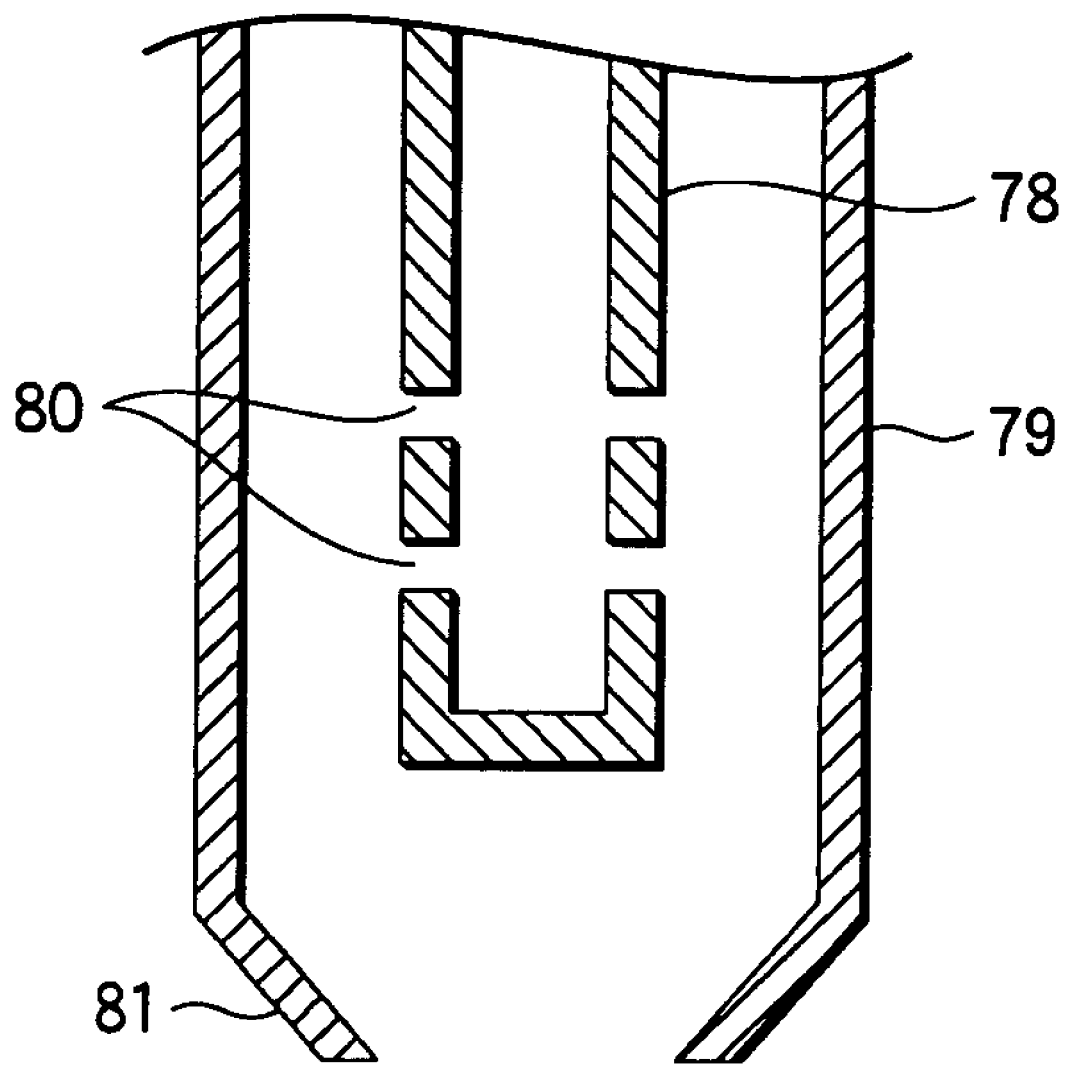
FIG. 9 This is a sectional side view showing a further alternative preferable example of a rinsing liquid supply nozzle.

In order to give weight to the low impact, as shown in the sectional side view of FIG. 8, the rinsing liquid supply nozzle may be arranged to have a porous body 76 attached at the distal end of a nozzle main body 75. Alternatively, as shown in the sectional side view of FIG. 9, the rinsing liquid supply nozzle may be arranged to have a double tube structure formed of an inner tube 78 and an outer tube 79. The inner tube 78 has delivery holes 80 formed on the sidewall, and the outer tube 79 has a constriction portion 81 formed at the distal end. According to the nozzle shown in FIG. 8, the porous body 76 provides a buffer action to deliver the rinsing liquid with a low impact. According to the nozzle shown in FIG. 9, the delivery holes 80 in the sidewall weaken the impact of the delivery flow therefrom, and the constriction portion 81 of the outer tube 79 narrows down the rinsing liquid thus delivered to form a delivery flow with a small sectional area.

Placement of the rinsing liquid supply nozzle 13 is preferably designed as follows.

Figure 10:
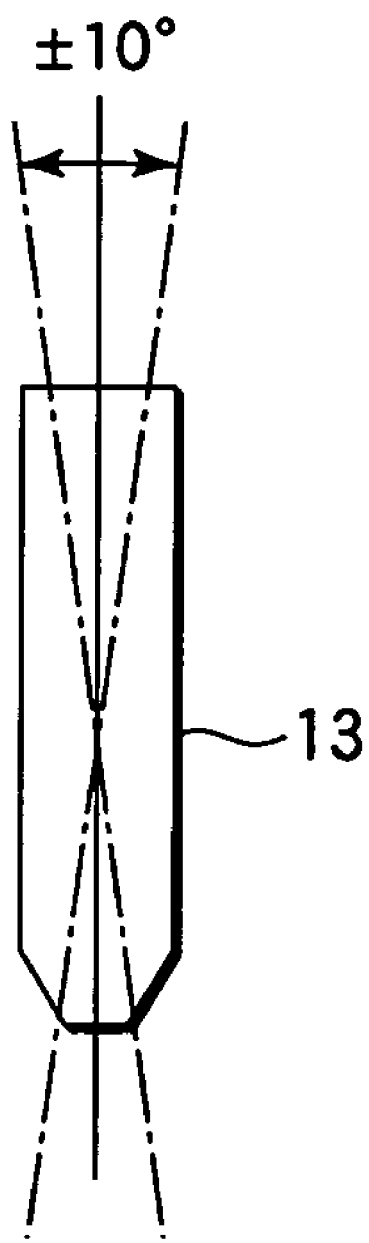
FIG. 10 This is a side view showing preferable placement of a rinsing liquid supply nozzle.

In general, there is a case where developing apparatuses include liquid supply nozzles disposed slantwise because of the space. Such placement causes no problem where the nozzles are used to supply purified water. However, the surfactant-containing rinsing liquid is a low surface tension fluid and thus is not good in the cutoff of the liquid. If the rinsing liquid supply nozzle 13 is disposed slantwise, the liquid drips easily. Accordingly, as shown in FIG. 10, the rinsing liquid supply nozzle 13 is preferably disposed to be vertical or almost vertical. Even if the nozzle 13 is inclined, the inclination angle is preferable set to be not more than about 10°.

Next, an explanation will be given of a rinsing liquid supply system that can shorten the rinsing time.

The developing apparatus shown in FIGS. 1 to 3 employs the purified water supply nozzle 12 for performing purified water rinsing after the developing process, and the rinsing liquid supply nozzle 13 for performing a rinsing process with the surfactant-containing rinsing liquid. In other words, two nozzles are used to perform the purified water rinsing and the rinsing using the surfactant-containing rinsing liquid. This arrangement requires a lager space for disposing nozzle transfer mechanisms and so forth, and thus increases the size of the apparatus. Further, this arrangement requires a time necessary for switching the nozzles, and thus prolongs the time for performing the entire rinsing process. On the other hand, this embodiment employs a rinsing liquid supply system shown in FIG. 11 to solve this problem. The system shown in FIG. 11 includes a purified water tank 83 and a surfactant solution tank 84. A line 85 extends from the purified water tank 83 and a line 86 extends from the surfactant solution tank 84. The lines 85 and 86 are connected to a mixing valve 91, and a liquid from the mixing valve 91 is supplied through a line 92 into a nozzle 93. The line 85 is provided with a pump 87 and a flow controller (FC) 89 disposed thereon. The line 86 is provided with a pump 88 and a flow controller 90 disposed thereon. According to this system, the flow controllers (FC) 89 and 90 are used to control the flow rates of both the purified water and surfactant solution. Consequently, the nozzle 93 can be used to deliver the purified water alone, and can be further used to deliver the surfactant-containing rinsing liquid with a predetermined concentration obtained by adjusting blending of the purified water and surfactant solution. In other words, one nozzle 93 can serve the functions of both the purified water supply nozzle 12 and rinsing liquid supply nozzle 13 of the apparatus shown in FIGS. 1 to 3 described above.

Figure 12:
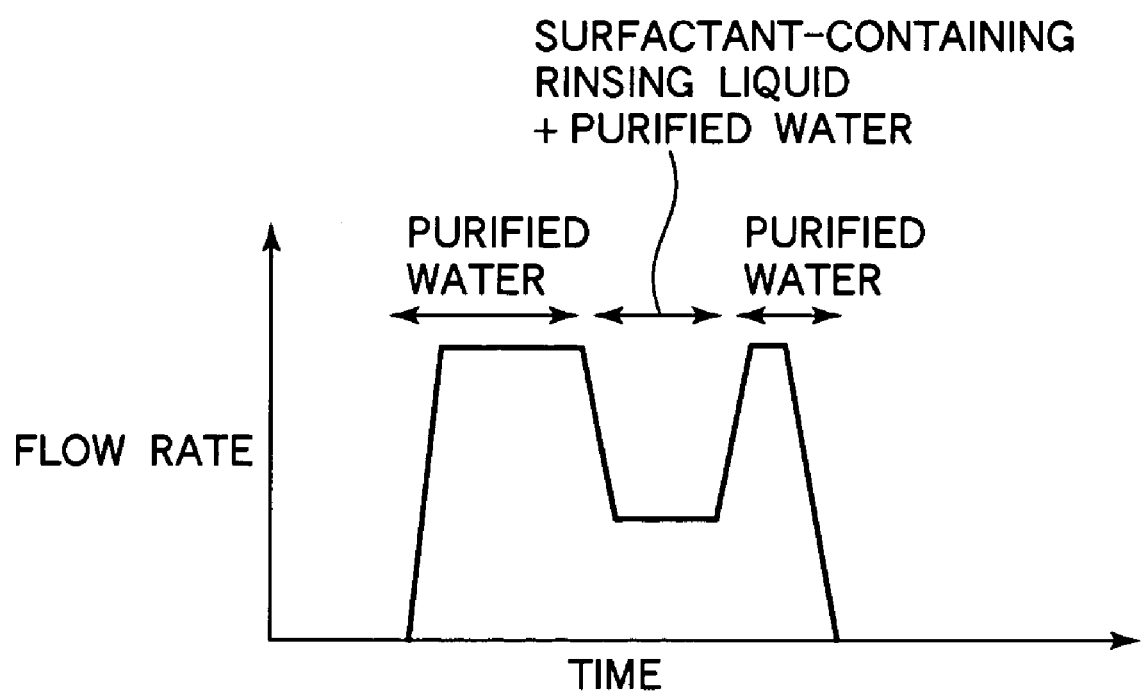
FIG. 12 This is a timing chart showing an example of rinsing control by the rinsing liquid supply system shown in FIG. 11.

For example, this system can perform rinsing control, as shown in the timing chart of FIG. 12. Specifically, at first, the flow controllers (FC) 89 and 90 are adjusted to deliver the purified water alone from the nozzle 93 at a relatively high flow rate of, e.g., 1,200 mL/min, thereby performing purified water rinsing. Then, the flow controllers (FC) 89 and 90 are adjusted to mix the surfactant solution with the purified water at a predetermined ratio and to deliver the surfactant-containing rinsing liquid from the nozzle 93 at a relatively low flow rate of, e.g., 240 mL/min, thereby performing rinsing. After the rinsing process using the surfactant-containing rinsing liquid is finished, the purified water is solely supplied into the nozzle 93 to clean it, thereby preparing for a subsequent process.

As described above, one nozzle mechanism replaces two nozzle mechanisms required in the apparatus shown in FIGS. 1 to 3, so that the necessary space is smaller and the process time is shorter. Further, the flow controllers (FC) 89 and 90 allow the flow rates to be controlled with high accuracy.

Figure 11:
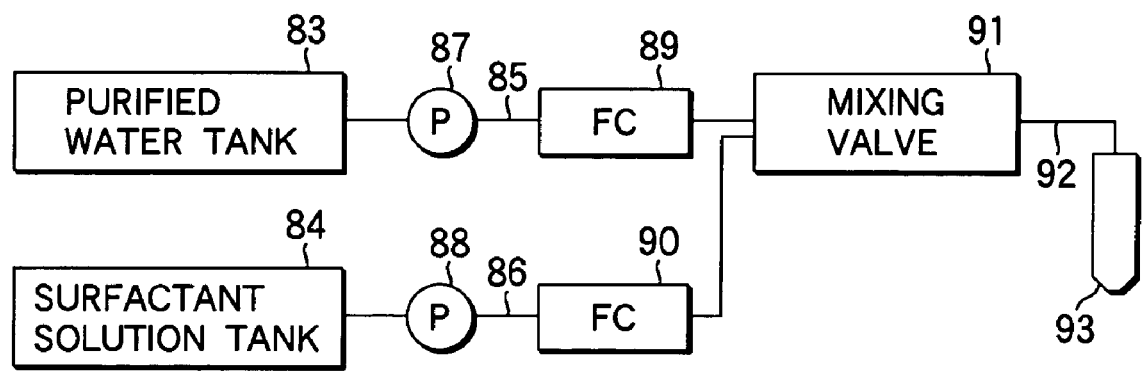
FIG. 11 This is a structural view schematically showing a preferable rinsing liquid supply system.
Figure 13:
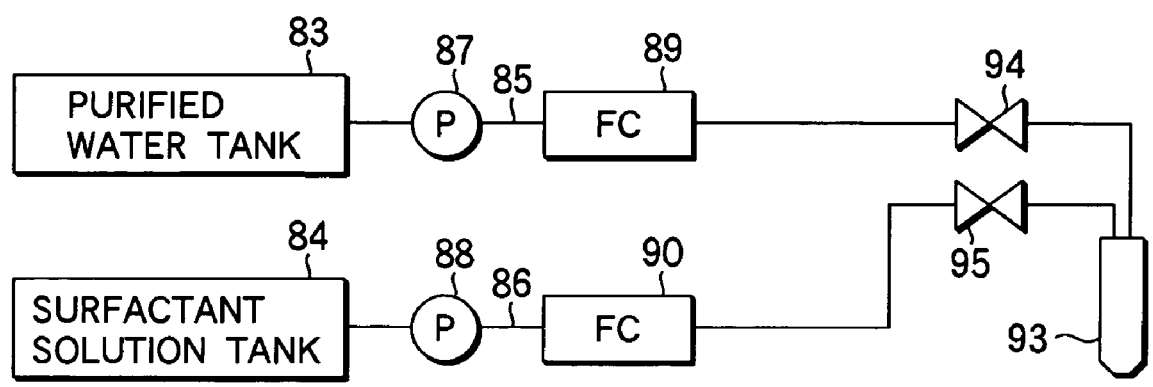
FIG. 13 This is a structural view schematically showing a modification of the rinsing liquid supply system shown in FIG. 11.

FIG. 13 is a view showing a modification of the rinsing liquid supply system shown in FIG. 11, wherein no mixing valve is used. In this modification, lines 85 and 86 are directly connected to a nozzle 93, and are provided with valves 94 and 95, respectively, disposed near the nozzle 93. According to this system, the flow controllers (FC) 89 and 90 and valves 94 and 95 are operated to control the supply rates of the purified water and surfactant solution supplied to the nozzle 93. Consequently, the purified water and surfactant solution can be mixed in the nozzle 93, as needed, so as to perform rinsing control similarly to the system shown in FIG. 11.

The present invention is not limited to the embodiments described above, and it may be modified in various manners. For example, in the embodiments described above, the water-based cleaning liquid is exemplified by purified water, but the liquid may be prepared by adding a small amount of another substance into purified water. Further, in the embodiments described above, the present invention is applied to a developing process performed on a semiconductor wafer, but this is not limiting. For example, the present invention may be applied to a developing process performed on another substrate, such as a substrate for liquid crystal display devices (LCD), as long as a miniaturized resist pattern is formed on the substrate. Furthermore, the present invention includes various modifications made by suitably combining some of the components of the embodiments described above or removing a part of the components, as long as they do not depart from the scope of the present invention.

The invention claimed is:

1. A rinsing method for performing a rinsing process on a substrate, after a developing process is performed on a light-exposed pattern disposed thereon, the method comprising, in a following order:

a first step of throwing off a developing solution from the substrate after development;

a second step of supplying a water-based cleaning liquid onto the substrate, the second step is arranged to supply, as the water-based cleaning liquid, purified water along with the developing solution onto the substrate to perform rinsing on the substrate;

a third step of supplying a rinsing liquid onto the substrate without supplying the developing solution to replace liquid remaining on the substrate with the rinsing liquid; and a fourth step of rotating the substrate without out supplying either the developing solution or the rising liquid to expand and throw off the rinsing liquid on the substrate, wherein the rinsing liquid consists essentially of purified water containing a surfactant at a concentration of 10,000 ppm or less, the third step is arranged to supply the rinsing liquid through a rinsing liquid supply nozzle for a supply time of 5 seconds or less, the rinsing liquid supply nozzle has a double tube structure formed of an inner tube and an outer tube such that the inner tube has delivery holes formed on the sidewall and the outer tube has a constriction portion formed at a distal end, and is configured to deliver the rinsing liquid through the constriction portion so as to weaken an impact of a delivery flow of the rinsing liquid, and the fourth step is arranged to include a first period with a lower rotation number and a second period with a higher rotation number set in this order, such that the first period is a period of rotating the substrate at a first rotation number of more than 300 rpm and less than 1,000 rpm for a time of 5 to 15 seconds and the second period is a period of rotating the substrate at a second rotation number of 1,000 to 4,000 rpm for a time of 10 to 20 seconds.

2. The rinsing method according to claim 1, wherein the constriction portion of the rinsing liquid supply nozzle has a total delivery-opening area of 3 to 20 mm².

3. The rinsing method according to claim 1, wherein the rinsing liquid supply nozzle is disposed to be at least substantially vertical.

4. A developing method for developing a light-exposed pattern, after a resist film disposed on a substrate is subjected to light exposure with a predetermined pattern, the method comprising, in a following order:

a first step of applying a developing solution onto the resist film disposed on the substrate after the light exposure;

a second step of holding the applied developing solution stationary to promote development;

a third step of throwing off the developing solution from the substrate after the development;

a fourth step of supplying a water-based cleaning liquid onto the substrate, the fourth step is arranged to supply, as the water-based cleaning liquid, purified water along with the developing solution onto the substrate to perform rinsing on the substrate;

a fifth step of supplying a rinsing liquid onto the substrate without supplying the developing solution to replace liquid remaining on the substrate with the rinsing liquid; and a sixth step of rotating the substrate without supplying either the developing solution or the rising liquid to expand and throw off the rinsing liquid on the substrate, wherein the rinsing liquid consists essentially of purified water containing a surfactant at a concentration of 10,000 ppm or less, the fifth step is arranged to supply the rinsing liquid through a rinsing liquid supply nozzle for a supply time of 5 seconds or less, the rinsing liquid supply nozzle having a double tube structure formed of an inner tube and an outer tube such that the inner tube has delivery holes formed on the sidewall and the outer tube has a constriction portion formed at a distal end, and is configured to deliver the rinsing liquid through the constriction portion so as to weaken an impact of a delivery flow of the rinsing liquid, and the sixth step is arranged to include a first period with a lower rotation number and a second period with a higher rotation number set in this order, such that the first period is a period of rotating the substrate at a first rotation number of more than 300 rpm and less than 1,000 rpm for a time of 5 to 15 seconds and the second period is a period of rotating the substrate at a second rotation number of 1,000 to 4,000 rpm for a time of 10 to 20 seconds.

5. The developing method according to claim 4, wherein the constriction portion of the rinsing liquid supply nozzle has a total delivery-opening area of 3 to 20 mm².

6. The rinsing method according to claim 4, wherein the rinsing liquid supply nozzle is disposed to be at least substantially vertical.

* * * * *